United States Patent [19]

Kodera et al.

[11] Patent Number: 5,578,531
[45] Date of Patent: Nov. 26, 1996

[54] METHOD FOR MANUFACTURING SEMICONDUCTOR DEVICE

[75] Inventors: Masako Kodera, Kawasaki; Atsushi Shigeta, Yamato, both of Japan; Hiroyuki Yano, Wappingers Falls, N.Y.

[73] Assignee: Kabushiki Kaisha Toshiba, Kawasaki, Japan

[21] Appl. No.: 547,581

[22] Filed: Oct. 24, 1995

Related U.S. Application Data

[63] Continuation of Ser. No. 212,874, Mar. 15, 1994, abandoned.

[30] Foreign Application Priority Data

Mar. 29, 1993 [JP] Japan ................................. 5-069683

[51] Int. Cl.$^6$ ............................................. H01L 21/304
[52] U.S. Cl. ........................................ 437/228; 437/240
[58] Field of Search .............................. 437/228, 195, 437/240, 225, 228 PL

[56] References Cited

U.S. PATENT DOCUMENTS

| | | | |
|---|---|---|---|
| 4,652,334 | 3/1987 | Jain et al. | |
| 5,106,770 | 4/1992 | Bulat et al. | 437/40 |
| 5,169,491 | 12/1992 | Doan | 437/228 |
| 5,215,787 | 6/1993 | Homma | 156/656 |
| 5,272,117 | 12/1993 | Roth et al. | 156/653 |
| 5,302,551 | 4/1994 | Iranmanesh et al. | 437/228 |
| 5,334,552 | 8/1994 | Homma | 437/228 |

*Primary Examiner*—Tom Thomas
*Assistant Examiner*—Michael Trinh
*Attorney, Agent, or Firm*—Finnegan, Henderson, Farabow, Garrett & Dunner, L.L.P.

[57] ABSTRACT

First through fourth wiring layers are formed on the surface of a silicon substrate, then a silicon oxide layer containing fluorine is deposited over the wiring layers and the silicon substrate, and then another silicon oxide layer containing no fluorine is deposited over the silicon oxide layer containing fluorine. Subsequently, the silicon oxide layer containing no fluorine is flattened by polishing it for a predetermined length of time when the silicon oxide layer containing no fluorine is polished, the silicon oxide layer containing fluorine serves as a stopper, since the polishing rate of the silicon oxide layer containing fluorine is lower than that of the silicon oxide layer containing no fluorine.

9 Claims, 2 Drawing Sheets

| TYPE OF SILICON OXIDE LAYER | | POLISHING RATE |
|---|---|---|
| SILICON OXIDE LAYER CONTAINING FLUORINE | SILICON OXIDE LAYER FORMED BY DEPOSITION OF SILICON OXIDE FROM SATURATED HYDROFLUOSILIC ACID SOLUTION | 3900 Å/min |
| | SILICON OXIDE LAYER FORMED BY PLASMA CVD USING F-ADDED TEOS MATERIAL GAS | 5000 Å/min |
| SILICON OXIDE LAYER CONTAINING NO FLUORINE | THERMAL OXIDIZED LAYER | 7000 Å/min |
| | SILICON OXIDE LAYER FORMED BY PLASMA CVD USING TEOS MATERIAL GAS | 8000 Å/min |

| TYPE OF SILICON OXIDE LAYER | | POLISHING RATE |
|---|---|---|
| SILICON OXIDE LAYER CONTAINING FLUORINE | SILICON OXIDE LAYER FORMED BY DEPOSITION OF SILICON OXIDE FROM SATURATED HYDROFLUOSILIC ACID SOLUTION | 3900 Å/min |
| | SILICON OXIDE LAYER FORMED BY PLASMA CVD USING F-ADDED TEOS MATERIAL GAS | 5000 Å/min |
| SILICON OXIDE LAYER CONTAINING NO FLUORINE | THERMAL OXIDIZED LAYER | 7000 Å/min |
| | SILICON OXIDE LAYER FORMED BY PLASMA CVD USING TEOS MATERIAL GAS | 8000 Å/min |

FIG. 7

METHOD FOR MANUFACTURING SEMICONDUCTOR DEVICE

This application is a continuation of application Ser. No. 08/212,874, filed Mar. 15, 1994, now abandoned.

BACKGROUND OF THE INVENTION

1. Field of the Invention

The present invention relates to a method for manufacturing a semiconductor device, and more particularly to a step of flattening a silicon oxide layer formed on a projected or depressed surface of a semiconductor device.

2. Description of the Related Art

A conventional semiconductor device-manufacturing method includes a step of forming a projected structure and a depressed structure on a silicon substrate. The projected structure is, for example, an electrode, a capacitor, a wiring layer, or the like, while the depressed structure is, for example, a trench, a contact hole, or the like. A silicon oxide ($SiO_2$) layer is formed over the projected and depressed structures. In general, an "etch back" process and a "re-flow" process are used for flattening the silicon oxide layer, but these processes cannot completely flatten the silicon oxide layer. Since projected or depressed portions remain on the silicon oxide layer, the subsequent steps have to be carried out under various restrictions.

FIG. 1 and FIG. 2 are cross sectional views showing one conventional semiconductor device-manufacturing method. Referring to these FIGURES, first to fourth electrodes 2 to 5 are formed on a silicon substrate 1, and then a silicon oxide layer 6 is deposited over the electrodes 2 to 5 and silicon substrate 1. Subsequently, resist 7 is coated on the silicon oxide layer 6 by spin coating. This resist coating 7 has different thicknesses, depending upon the locations. To be specific, of the portions of the resist coating 7, the portion located above the region between the third and fourth electrodes 4 and 5 and the portion located above the fourth electrode 5 are inevitably thinner than the portions located above the first to third electrodes 2 to 4. In other words, the resist coating 7 is thin at portions located above the region between distantly-arranged electrodes and at portions located above wide electrodes, and is thick at portions located above the region between closely-arranged electrodes and at portions located above narrow electrodes.

Thereafter, the resist coating 7 and the silicon oxide layer 6 are etched back so as to flatten the silicon oxide layer 6. As a result, the silicon oxide layer 6 has different thicknesses, depending upon the locations. To be specific, of the portions of the silicon oxide layer 6, the portion located above the region between the third and fourth electrodes 4 and 5 and the portion located above the fourth electrode 5 become thinner than the portions located above the first to third electrodes 2 to 4. In other words, after the "etch back" process, the silicon oxide layer 6 becomes thick at portions overlaid with a thick resist coating, and becomes thin at portions overlaid with a thin resist coating. Therefore, the silicon oxide layer 6 has projected and depressed portions even after it is flattened in the "etch back" process.

FIGS. 3 and 4 are cross sectional views showing another conventional semiconductor device-manufacturing method. Referring to these FIGURES, first to fourth electrodes 12 to 15 are formed on a silicon substrate 11, and then a BPSG (boron phosphorous silicon glass) layer 16 is deposited over the electrodes 12 to 15 and silicon substrate 11.

Subsequently, the BPSG layer 16 is heated to re-flow, as shown in FIG. 4, so as to flatten the BPSG layer 16. The result of this "re-flow" process is similar to that of the "etch back" process mentioned above. That is, after the "re-flow" process, the BPSG layer 16 is thin at portions located above the region between distantly-arranged electrodes and at portions located above wide electrodes, and is thick at portions located above the region between closely-arranged electrodes and at portions located above narrow electrodes. Therefore, the BPSG layer 16 has projected and depressed portions even after it is flattened in the "re-flow" process.

A recently-developed submicron device has a high degree of integration. In this type of device, the central and peripheral portions of a semiconductor chip are greatly different in level, and the pitch of wiring layers is very short. An insulation layer of the sub-micron device has projected and depressed portions even after it is flattened in either the "etch back" process or "re-flow" process mentioned above, and the projected and depressed portions become a serious problem when a wiring layer and other structural elements are formed on the insulation layer. For example, if a wiring layer is formed on the projected and depressed portions of the insulation layer by deposition, accurate focusing is not ensured at the time of an exposure operation for patterning that wiring layer. As a result, the wiring layer is not patterned accurately, and the sections into which it is patterned have shapes deviating from the intended shapes. Consequently, the resultant semiconductor device does not have reliable electrical characteristics; it may have defects, such as open wiring layer sections.

SUMMARY OF THE INVENTION

Accordingly, an object of the present invention is to provide a semiconductor device-manufacturing method which enables the surface of a semiconductor device to be completely flattened by means of a polishing technique which uses a fluorine-containing silicon oxide layer as a stopper.

This object is achieved by a semiconductor device-manufacturing method comprising the steps of:

depositing a fluorine-containing silicon oxide layer over the surface of a semiconductor substrate having projected and depressed portions;

depositing a silicon oxide layer containing no fluorine over the fluorine-containing silicon oxide layer; and polishing the silicon oxide layer containing no fluorine with the fluorine-containing silicon oxide layer used as a stopper, to thereby flatten the surface of the semiconductor device having the projected and depressed portions.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention and, together with the general description given above and the detailed description of the preferred embodiment given below, serve to explain the principles of the invention.

FIG. 7 shows the polishing rate of each silicon oxide layer.

DETAILED DESCRIPTION OF THE PREFERRED EMBODIMENT

A description will now be given of one embodiment of the present invention with reference to FIGS. 5 to 7 of the accompanying drawings.

Figure 1:
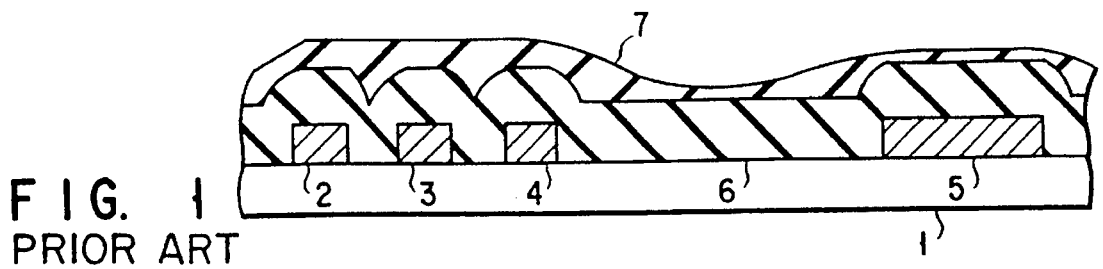
FIG. 1 is a sectional view showing a conventional semiconductor device-manufacturing method.
Figure 2:
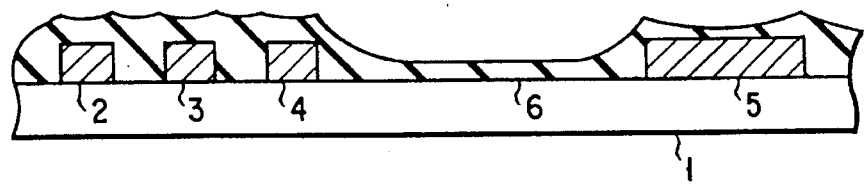
FIG. 2 is also a sectional view showing the conventional semiconductor device-manufacturing method and depicts a state obtained one step after the state indicated in FIG. 1.
Figure 3:
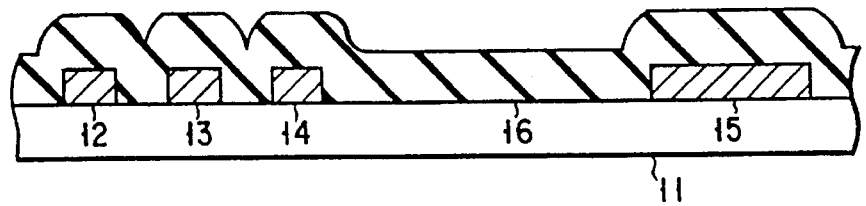
FIG. 3 is a sectional view showing another conventional semiconductor device-manufacturing method.
Figure 4:
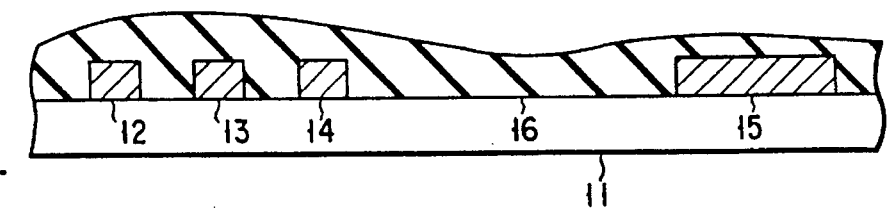
FIG. 4 is also a sectional view showing the second conventional semiconductor device-manufacturing method and depicts a state obtained one step after the state indicated in FIG. 3.
Figure 5:
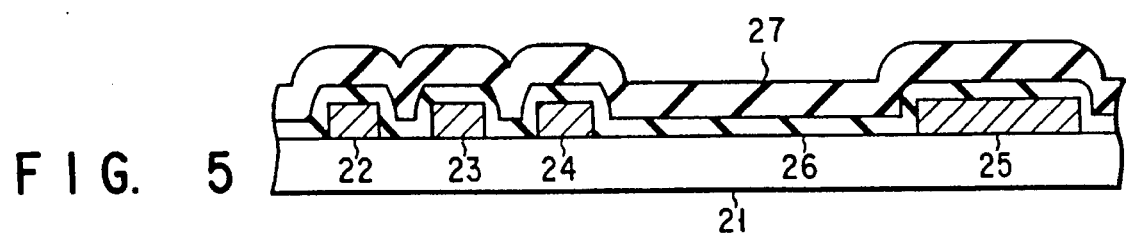
FIG. 5 is a sectional view showing a semiconductor device-manufacturing method of the present invention.
Figure 6:
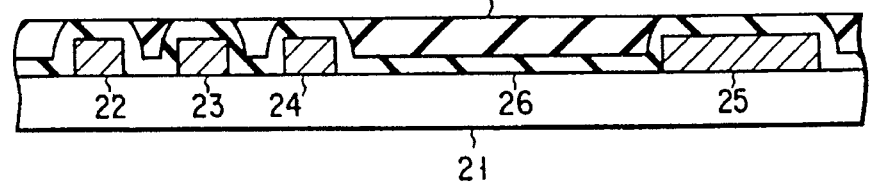
FIG. 6 is also a sectional view showing the semiconductor device-manufacturing method of the present invention and depicts a state obtained one step after the state indicated in FIG. 5.

FIGS. 5 and 6 are sectional views showing a semiconductor device-manufacturing method of the present invention, and FIG. 7 shows the polishing rate of each silicon oxide layer. Referring first to FIG. 5, first through fourth patterned wiring layers 22 to 25 are formed on the surface of a silicon substrate 21. Then, a silicon oxide ($SiO_2$) layer 26 containing greater than 0.1% by weight of fluorine is formed over the wiring layers 22 to 25 and the silicon substrate 21 by plasma CVD (chemical vapor deposition), wherein a TEOS (tetraethyl orthosilicate) gas to which $NF_3$ (a fluorine compound gas) is added is used as a material gas. Subsequently, another silicon oxide ($SiO_2$) layer 27 containing no fluorine (not more than 0.1% by weight of fluorine, even if contained) is formed over silicon oxide layer 26 by plasma CVD, wherein a TEOS gas to which $NF_3$ (a fluorine compound gas) is not added is used as a material gas. The silicon oxide layer 27 containing no fluorine is deposited to have a thickness greater than the thickness of the wiring layers 22 to 25.

Thereafter, the silicon oxide layer 27 containing no fluorine is polished for a predetermined time, as shown in FIG. 6. The polishing rate becomes low when the surface of the silicon oxide layer 26 containing fluorine is exposed by polishing. The reason for this is that the polishing rate of the silicon oxide layer 26 containing fluorine is lower than that of the silicon oxide layer 27 containing no fluorine, as shown in FIG. 7, and that the former silicon oxide layer 26 serves as a stopper when the latter silicon oxide layer 27 is polished. Therefore, when the silicon oxide layer 26 containing fluorine begins to be polished, the polishing rate becomes significantly low as if it were zero. At this moment of time, the polishing operation is stopped, so that the surface of the polished silicon oxide layer 27 containing no fluorine is at the same level as the surface of the silicon oxide layer 26 containing fluorine. In this manner, the surface of the semiconductor device can be completely flattened.

As is shown in FIG. 7, a silicon oxide layer formed by the reaction of depositing silicon oxide from a saturated hydrofluosilic acid solution has a polishing rate of approximately 3,900 angstroms/min, and contains about 4% by weight of fluorine. A silicon oxide layer formed by the plasma CVD using an F-added TEOS material gas has a polishing rate of approximately 5,000 angstroms/min, and contains about 1% by weight of fluorine. A silicon oxide layer formed by thermal oxidation and containing no fluorine (not more than 0.1% by weight of fluorine, if contained) has a polishing rate of approximately 7,000 angstroms/min. A silicon oxide layer formed by the plasma CVD using a TEOS material gas and containing no fluorine (not more than 0.1% by weight of fluorine, if contained) has a polishing rate of approximately 8,000 angstroms/min.

In the embodiment mentioned above, the silicon oxide layer 26 containing fluorine is deposited over the wiring layers 22 to 25 and the silicon substrate 21, then the second silicon oxide layer 27 containing no fluorine is deposited over the fluorine-containing silicon oxide layer 26, and then the second silicon oxide layer 27 is polished for a certain length of time. Since, as shown in FIG. 7, the polishing rate of a silicon oxide layer containing fluorine is greatly lower than that of a silicon oxide layer containing no fluorine, the polishing rate becomes very low when silicon oxide layer 26 begins to be polished. In other words, this silicon oxide layer 26 serves as a stopper. Therefore, the thickness of that portion of silicon oxide layer 27 which is to be removed by polishing (i.e., a degree of polishing) can be accurately controlled on the basis of the polishing time. In addition, a uniformity in the wafer surface can be easily attained after polishing.

It should be also noted that the silicon oxide layer 26 containing fluorine is low in dielectric constant in comparison with the silicon oxide layer 27 containing no fluorine. Therefore, the electric capacity between the first to fourth wiring layers 22 to 25 can be suppressed. For this reason, the fluorine-containing silicon oxide layer 26 has characteristics suitable for an interlayer insulation layer. If the fluorine-containing silicon oxide layer 26 is employed as an interlayer insulation layer, the performance of the resultant semiconductor device (i.e., the capacity of the device) can be significantly improved.

In general, in the case where a silicon oxide layer is employed as an insulation layer, a silicon nitride layer is used as a stopper at the time of a polishing operation for flattening the insulation layer. However, the use of the silicon nitride layer as a stopper is not desirable in that the steps of forming and patterning the silicon nitride layer are additionally required and in that the subsequent steps become complex. In view of these problems, it is advantageous to use a silicon oxide layer as a stopper. In the case where the silicon oxide layer is used as a stopper at the time of flattening, the step of providing a stopper formed of a material (e.g., silicon nitride) different from that of an insulation layer is not required, thus contributing to a decrease in the total number of steps required. In addition, the subsequent steps can be carried out without any particular restrictions since no silicon nitride layer is formed between layers.

In the above description of the embodiment, the first through fourth wiring layers 22 to 25 were referred to as elements constituting the projected portions of the silicon substrate 21. However, other elements, such as electrodes or capacitors, may constitute the projected portions, and the present invention can be reduced to practice without any problem in this case as well.

Likewise, the elements constituting the depressed portions of the silicon substrate 21 may be trenches, contact holes, or the like.

Although the silicon oxide layer 26 containing fluorine was described as being formed by the plasma CVD using a TEOS material gas to which $NF_3$ (a fluorine compound gas) was added, this in no way limits the present invention. The silicon oxide layer 26 may be formed by another process, for example, by the reaction of depositing silicon oxide from a saturated hydrofluosilic acid solution.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A method for manufacturing a semiconductor device wherein a depressed and projected structure due to wiring layers provided on a semiconductor substrate is flattened by depositing an insulation layer over the depressed and projected structure, the method comprising the steps of:

forming a first silicon oxide layer containing fluorine over a surface of the structure, a covered configuration by the first silicon oxide layer having projected portions and depressed portions remaining thereon;

forming a second silicon oxide layer containing no fluorine over the first silicon oxide layer to cover the depressed portions and projected portions, a thickness of the second silicon oxide layer exceeding a height of the projected portions; and polishing a part of the second silicon oxide layer until a polishing speed decreases when a portion of the first silicon oxide layer has been exposed.

2. A semiconductor device-manufacturing method according to claim 1, wherein said first silicon oxide layer is deposited by plasma CVD using a TEOS material gas to which a fluorine compound gas is added.

3. A semiconductor device-manufacturing method according to claim 1, wherein said first silicon oxide layer is formed by a reaction of depositing silicon oxide from a saturated hydrofluosilic acid solution.

4. A semiconductor device-manufacturing method according to claim 1, wherein said second containing no fluorine is deposited by plasma CVD using a TEOS material gas.

5. A semiconductor device-manufacturing method according to claim 1, wherein said second silicon oxide layer is deposited by thermal oxidation.

6. A semiconductor device-manufacturing method according to claim 2, wherein a polishing rate of said first silicon oxide layer is approximately 5,000 angstroms/min, and said first silicon oxide layer contains about 1% by weight of fluorine.

7. A semiconductor device-manufacturing method according to claim 3, wherein a polishing rate of said first silicon oxide layer is approximately 3,900 angstroms/min, and said first silicon oxide layer contains about 4% by weight of fluorine.

8. A semiconductor device-manufacturing method according to claim 4, wherein a polishing rate of said second silicon oxide layer is approximately 8,000 angstroms/min.

9. A semiconductor device-manufacturing method according to claim 5, wherein a polishing rate of said second silicon oxide layer is approximately 7,000 angstroms/min.

\* \* \* \* \*